United States Patent
Rebibis et al.

(10) Patent No.: US 7,476,980 B2
(45) Date of Patent: Jan. 13, 2009

(54) DIE CONFIGURATIONS AND METHODS OF MANUFACTURE

(75) Inventors: Kenneth Rebibis, Dresden (DE); Soo Gil Park, Radebeul (DE)

(73) Assignee: Infineon Technologies AG, Munich (DE)

( * ) Notice: Subject to any disclaimer, the term of this patent is extended or adjusted under 35 U.S.C. 154(b) by 80 days.

(21) Appl. No.: 11/475,720

(22) Filed: Jun. 27, 2006

(65) Prior Publication Data
US 2007/0298603 A1 Dec. 27, 2007

(51) Int. Cl.
H01L 23/48 (2006.01)
H01L 23/52 (2006.01)
H01L 29/40 (2006.01)

(52) U.S. Cl. ............... 257/782; 257/706; 257/E21.32; 257/E21.497; 257/E21.503; 257/E21.508

(58) Field of Classification Search ............... 257/782, 257/706, 347, 296, 288, 720, 737, 738, 762, 257/765, 784
See application file for complete search history.

(56) References Cited

U.S. PATENT DOCUMENTS

| 5,528,462 | A * | 6/1996 | Pendse ................... 361/767 |
| 6,326,700 | B1 | 12/2001 | Bai et al. |
| 7,199,466 | B2 * | 4/2007 | Chiu ..................... 257/707 |
| 7,290,596 | B2 * | 11/2007 | Yang et al. ............... 165/146 |
| 2003/0160319 | A1 * | 8/2003 | Zheng et al. ............. 257/712 |
| 2006/0096486 | A1 * | 5/2006 | Roller et al. ............. 102/205 |
| 2007/0109749 | A1 * | 5/2007 | Kwon .................... 361/719 |

OTHER PUBLICATIONS

"Thermal Interface Material Comparison: Thermal Pads vs. Thermal Grease," AMD Publication No. 26951, Apr. 2004, 15 pages.

* cited by examiner

*Primary Examiner*—David Nhu
(74) *Attorney, Agent, or Firm*—Slater & Matsil, L.L.P.

(57) ABSTRACT

A die configuration includes a die having an active side and an inactive side being opposed to the active side. The inactive side is connected to a heat sink. The connecting members can be provided on the active side.

23 Claims, 8 Drawing Sheets

DIE CONFIGURATIONS AND METHODS OF MANUFACTURE

TECHNICAL FIELD

The present invention relates to die configurations and methods of manufacturing die configurations.

BACKGROUND

Current semiconductor packaging requires the use of a chip carrier or interposer (e.g., a substrate) as the interconnect from the chip to a printed circuit board. This eliminates the tedious assembly process that most common chips undergo.

Furthermore, in a conventional semiconductor package, heat sinks are attached to the package. This results in a rather poor cooling performance.

What is therefore needed is a chip configuration, in the following also referred to as die configuration with an improved cooling performance.

SUMMARY OF THE INVENTION

Embodiments of the present invention provide die configurations and methods of manufacturing a die configuration with an improved cooling performance.

In accordance with an exemplary embodiment of the invention, a die configuration is provided, comprising a die having an active side and an inactive side being opposed to the active side, the inactive side being connected to a heat sink.

In accordance with another exemplary embodiment of the invention, a die configuration is provided, comprising a die, a first side of the die being connected to a heat sink and a second side of the die being opposed to the first side of the die and being connected to die configuration pad regions.

These and other features of the invention will be better understood in view of the following drawings and detailed description.

BRIEF DESCRIPTION OF THE DRAWINGS

For a more complete understanding of the present invention, and the advantages thereof, reference is now made to the following descriptions taken in conjunction with the accompanying drawing, in which.

For clarity, previously identified features retain their reference indicia in subsequent drawings.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

According to an exemplary embodiment of the invention, the die configuration further comprises thermal interface material between the inactive side of the die and the heat sink.

The heat sink may comprise or may be formed by a metal plate, in the following also referred to as leadframe.

Clearly, in an embodiment of the invention, the heat sink in a die package (also referred to as chip package) is directly attached to the die. "Directly" in this case is to be understood in that the heat sink is attached (connected) to the die, optionally via a thermal interface material, but without having any packaging material such as molding mass (e.g., epoxy resin) between the heat sink and the die. In other words, in one exemplary embodiment of the invention, there is no or only thermal conductive material between the heat sink and the die.

In an exemplary embodiment of the invention, the heat spreading performance and thus the cooling performance of the die configuration is improved and no external heat spreader is necessary, thereby also increasing module reliability. This results in product cost savings and in a fast turn around time.

The die configuration can include any kind of chip, e.g., a memory chip, a logic chip or a microprocessor chip. In other words, the die of the die configuration may have one or a plurality of electronic components such as resistors, capacitors, inductors, transistors, memory cells of any type (random access memory or read only memory), etc.

In order to contact the electronic component(s) in the die, the die configuration may have one or a plurality of die configuration pad regions. The die configuration pad regions may be connected to die pad regions of the die, which in turn are connected to the electronic component(s) in the die.

In an embodiment of the invention, die configuration connecting members may be provided, which may be connected to the die configuration pad regions. The die configuration connecting members may be solder members such as ball grid array (BGA) solder bumps.

In accordance with an embodiment of the invention, the solder members are lead free solder members.

In accordance with another embodiment of the invention, mold material may be provided around the die, wherein the inactive side of the die remains at least partially exposed. Thus, the at least partially exposed inactive side of the die can be used for connecting the die to an external device such as a printed circuit board (PCB).

Furthermore, the die configuration may further comprise die pad regions on the active side of the die, and die connecting members connecting the die configuration pad regions to the die pad regions. The die pad regions may be connected to electronic component(s) of the die.

In one embodiment of the invention, at least one die connecting member of the die connecting members comprises or is formed by a bump, for example a pillar bump, for example a metal bump. The metal bump can be made of any suitable metal, e.g., of copper.

In accordance with one embodiment of the invention, the bump comprises a first partial bump and a second partial bump, the second partial bump having a different (for example greater) width than the first partial bump.

In another embodiment of the invention, the die configuration connecting members may be located on the second partial bump. In this case, the die configuration connecting members, e.g., the solder bumps, are attached to the second partial bump, in other words to the partial bump with an enlarged cross section, which simplifies the mounting process and saves metal used for connecting the external device such as the printed circuit board to the die pads.

According to another exemplary embodiment of the invention, a die configuration is provided, comprising a die having an active side and an inactive side being opposed to the active side, a thermal interface material layer on the inactive side of the die, the thermal interface material layer being connected to a metal plate. In this embodiment, the metal plate, on the one hand, is used as a carrier of the dies during the manufacturing process, and, on the other hand, serves as the heat sink, which is directly connected to the die, thereby enhancing the die configuration's thermal performance.

The die configuration connecting members may connect the die configuration pad regions.

Moreover, the die configuration connecting members may be solder members.

In one configuration of the above-mentioned embodiment, mold material may be provided around the die, at least partially exposing the heat sink. Further, die pad regions may be provided on the active side of the die; and die connecting members may be provided connecting the die configuration pad regions to the die pad regions through the mold material.

According to another exemplary embodiment of the invention, a die configuration is provided, comprising a die, a first side of the die being connected to a heat sink, a second side of the die being opposed to the first side of the die and being connected to die configuration pad regions.

According to another exemplary embodiment of the invention, a die configuration is provided, comprising a die, a first side of the die being connected to a heat sink and a second side of the die being opposed to the first side of the die and being connected to die configuration pad regions, and a circuit board being connected to the die configuration pad regions.

The circuit board may be a printed circuit board.

According to another exemplary embodiment of the invention, a die configuration is provided, comprising a die, a first side of the die being connected to a metal plate, mold material around the die, at least partially exposing the metal plate, a second side of the die being opposed to the first side of the die and comprising die pad regions on the active side of the die, die configuration pad regions, die connecting members connecting the die configuration pad regions to the die pad regions through the mold material, and a printed circuit board being connected to the die configuration pad regions.

According to another exemplary embodiment of the invention, a die configuration is provided, comprising a die, a first side of the die being connected to a metal plate, mold material around the die, at least partially exposing the metal plate, a second side of the die being opposed to the first side of the die and comprising die pad regions on the active side of the die, die configuration pad regions, die connecting members connecting the die configuration pad regions to the die pad regions through the mold material, a printed circuit board being connected to the die configuration pad regions. Each die connecting member of the die connecting members may be formed by a metal pillar bump, the pillar bump comprising a first partial bump and a second partial bump, the second partial bump having a greater width than the first partial bump. The die configuration connecting members may be located on the second partial bump.

According to another exemplary embodiment of the invention, a die configuration is provided, comprising a die, mold material around the die, one side of the die comprising die pad regions, die configuration pad regions, die connecting members connecting the die configuration pad regions to the die pad regions through the mold material. Each die connecting member of the die connecting members may be formed by a bump, the bump comprising a first partial bump and a second partial bump, the second partial bump having a greater width than the first partial bump. Furthermore, die configuration connecting members may be provided and located on the second partial bump.

According to another exemplary embodiment of the invention, a method of manufacturing a die configuration is provided, comprising connecting an inactive side of a die, the inactive side of the die being opposed to an active side of the die, to a heat sink.

The connecting the inactive side of the die to a heat sink may further comprise depositing thermal interface material on the inactive side of the die, and connecting the heat sink to the thermal interface material.

In an exemplary embodiment of the invention, the method further comprises forming die connecting members on die pad regions being located on the active side of the die.

In an exemplary embodiment of the invention, the connecting the inactive side of the die to a heat sink comprises connecting the inactive side of the die to a metal plate.

In an exemplary embodiment of the invention, the forming of the die connecting members on die pad regions is carried out using at least one lithographic process. The lithographic process may be used to define the cross sectional width of the bumps to be manufactured.

In an exemplary embodiment of the invention, the forming of the die connecting members on die pad regions further comprises forming first partial connecting members, and forming second partial connecting members on the first partial connecting members.

Furthermore, in a configuration of the method, the forming of the die connecting members on die pad regions further comprises forming first partial connecting members and forming second partial connecting members on the first partial connecting members, the second partial connecting members having a greater width than the first partial connecting members.

In accordance with another embodiment of the invention, the forming of the die connecting members on die pad regions further comprises forming the first partial connecting members using a first lithography process, and forming the second partial connecting members using a second lithography process.

Furthermore, the forming of the die connecting members on die pad regions may be carried out using at least one metal plating process.

In accordance with another embodiment of the invention, the forming of the die connecting members on die pad regions further comprises plating the first partial connecting members on the die pad regions of the die using a first lithography process and plating the second partial connecting members on the first partial connecting members using a second lithography process.

Furthermore, the die can be diced (in other words separated) from other dies.

Further, the die or a plurality of dies can be attached to the heat sink, e.g., to a metal plate, which in this case also serves as a carrier of the die(s).

The method may further comprise molding the die(s) being attached to the heat sink, at least partially exposing the die connecting members.

The molding of the die(s) may be carried out using a tape molding process.

In accordance with another exemplary embodiment of the invention, the method further comprises mounting die configuration connecting members, such as solder bumps, on the die connecting members.

In accordance with another exemplary embodiment of the invention, the method further comprises coupling the die configuration connecting members to a printed circuit board.

In accordance with another exemplary embodiment of the invention, a method of manufacturing a die configuration is provided, comprising forming die connecting members on die pad regions being located on the active side of the die by forming first partial connecting members on the active side of the die and by forming second partial connecting members on the formed first partial connecting members, the second partial connecting members having a greater width than the first partial connecting members.

In accordance with another exemplary embodiment of the invention, the forming of the die connecting members on die pad regions further comprises plating the first partial connecting members on the die pad regions of the die using a first lithography process and plating the second partial connecting members on the first partial connecting members using a second lithography process.

Figure 1:
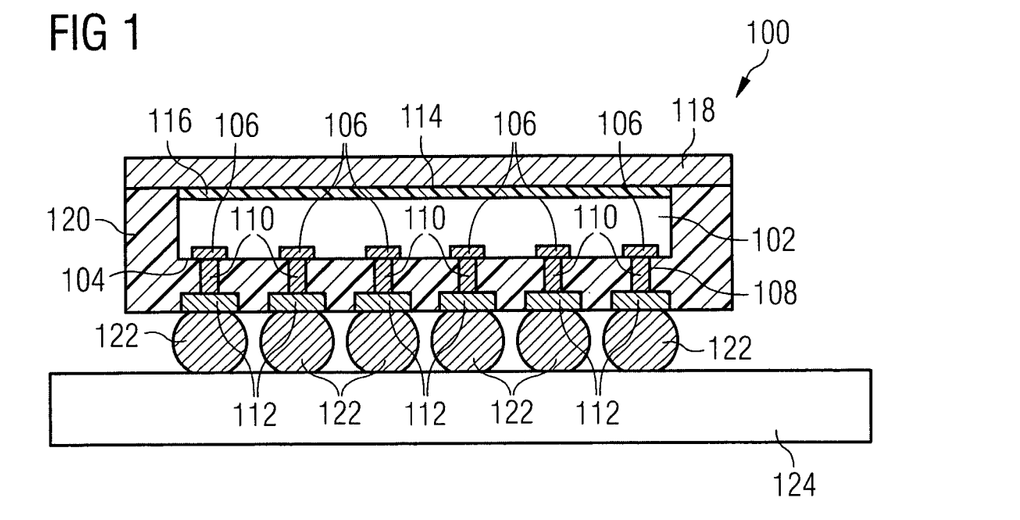
FIG. 1 illustrates a cross sectional view of a die configuration in accordance with an exemplary embodiment of the present invention.

FIG. 1 illustrates a cross sectional view of a die configuration 100 in accordance with an exemplary embodiment of the present invention.

The die configuration 100 has a die 102, also referred to as a chip 102. The die 102 has a plurality of electronic components (not shown), e.g., resistors, capacitors, inductors, transistors, memory cells of any type (random access memory or read only memory), etc., monolithically integrated therein. The die 102 can be a logic chip, a memory chip or a microprocessor chip. In another embodiment of the invention, the die 102 can be a hybrid chip comprising logic components as well as memory components (e.g., can include an embedded memory).

On an active side 104 of the die 102, die pads 106 are located, which are coupled with the electronic components in the die 102. The die pads 106 serve for die external electrical connection.

Furthermore, pillar bumps 108 made of an electrically conductive material, e.g., made of a metal such as copper or aluminum or any other suitable material, are arranged on the exposed surface of the die pads 106. As will be described in more detail below, the pillar bumps 108 may have any shape, for example a polygonal cross sectional shape, in an alternative embodiment, a circular cross sectional shape.

In one embodiment of the invention, one pillar bump 108 is provided for and connected to one respective die pad 106.

In one embodiment of the invention, each pillar bump 108 has two partial pillar bumps, a first partial pillar bump 110 and a second partial pillar bump 112. The first partial pillar bumps 110 are connected to the exposed die pads 106, respectively.

As will be described in more detail below, the first partial pillar bumps 110 have a first shape in their cross section and the second partial pillar bumps 112 have a second shape in their cross section. The first shape and the second shape may be of the same shape, however, the first shape and the second shape may also be of different shapes. In this exemplary embodiment of the invention, the first shape is a polygon, e.g., a hexagon, whereas the second shape is a circular shape.

On an inactive side 114 of the die 102, which is opposite to the active side 104 of the die 102, an optional thermal interface material layer 116 is provided. In an exemplary embodiment of the invention, this layer covers the entire surface of the inactive side 114 of the die 102. In one embodiment, the thermal interface material can be a thermal pad (e.g., a phase change material), a thermal adhesive or thermal grease. As one example, a reinforced or foam-based thermally conductive cured silicone gel can be used as the thermal interface material 116.

The surface of the thermal interface material layer 116 opposing the die 102 is attached to a metal plate 118.

Mold material 120 is provided on three sides of the die 102, thereby encapsulating the die 102 except for the metal plate 118 and the upper surfaces of the second partial pillar bumps 112, which remain exposed for connection with a printed circuit board or another desired external device.

Ball grid array solder bumps 122 made of lead-free solder material (e.g., made of Sn or of an Sn alloy) are formed on the exposed surfaces of the second partial pillar bumps 112 for solder connecting the printed circuit board 124 or another desired external device.

Figure 2:
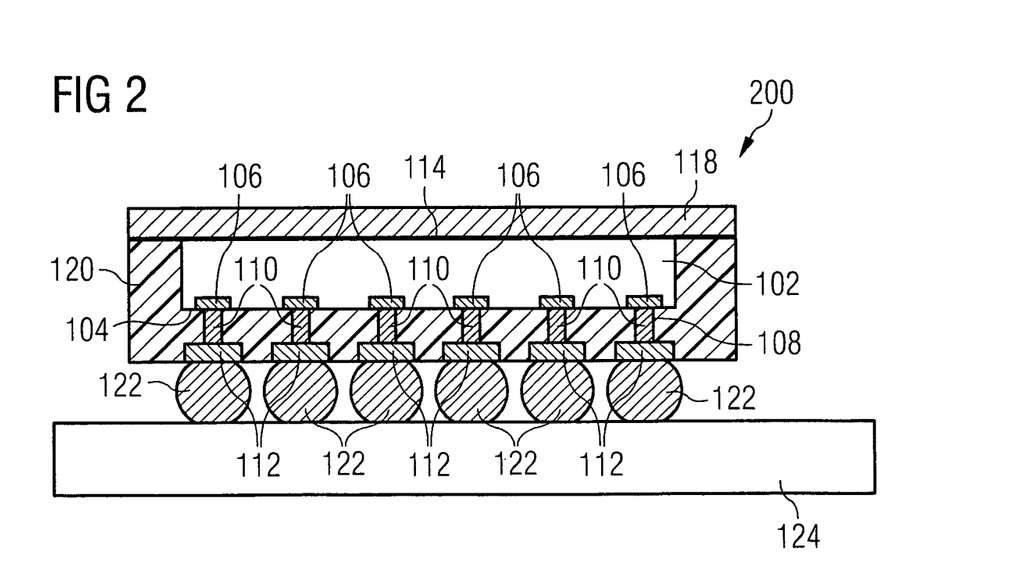
FIG. 2 illustrates a cross sectional view of a die configuration in accordance with another exemplary embodiment of the present invention.

FIG. 2 illustrates a cross sectional view of a die configuration 200 in accordance with another exemplary embodiment of the present invention.

The die configuration 200 is similar to the die configuration 100 as shown in FIG. 1 with the difference that the thermal interface material layer 116 is omitted in the die configuration 200 of FIG. 2. Thus, according to the die configuration 200, the metal plate 118 is directly connected to the inactive side 114 of the die 102.

Figure 3A:
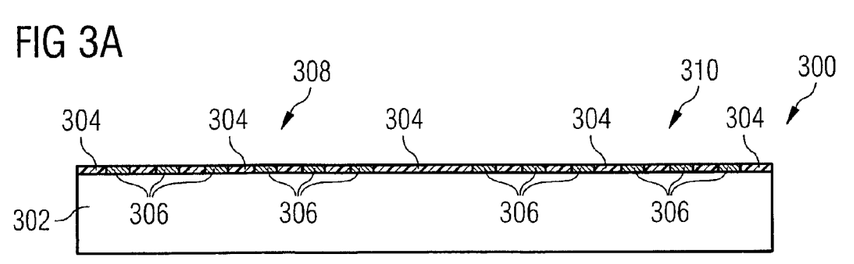
FIGS. 3A to 3S illustrate cross sectional views of a die configuration in accordance with an exemplary embodiment of the present invention at different time instants of its manufacture.
Figure 3B:
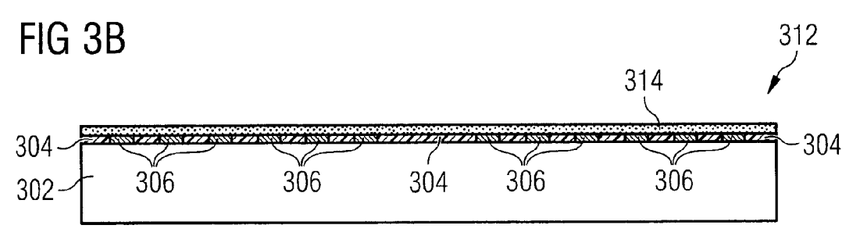
Figure 3C:
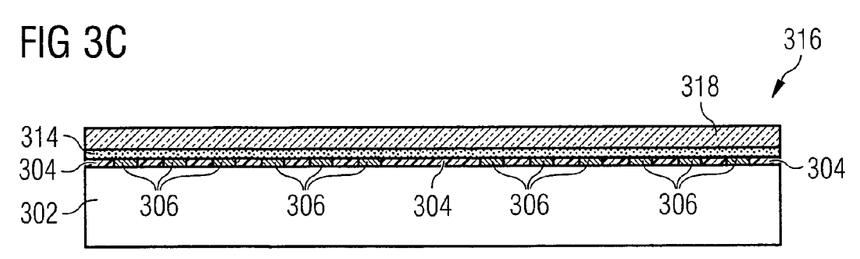
Figure 3D:
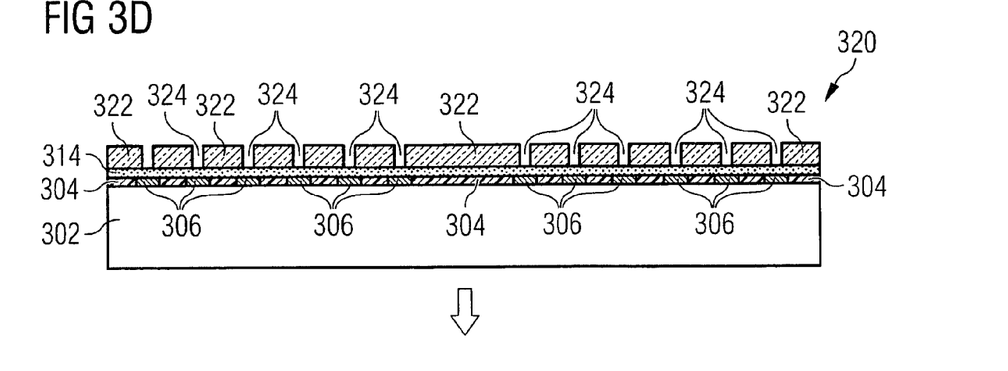
Figure 3E:
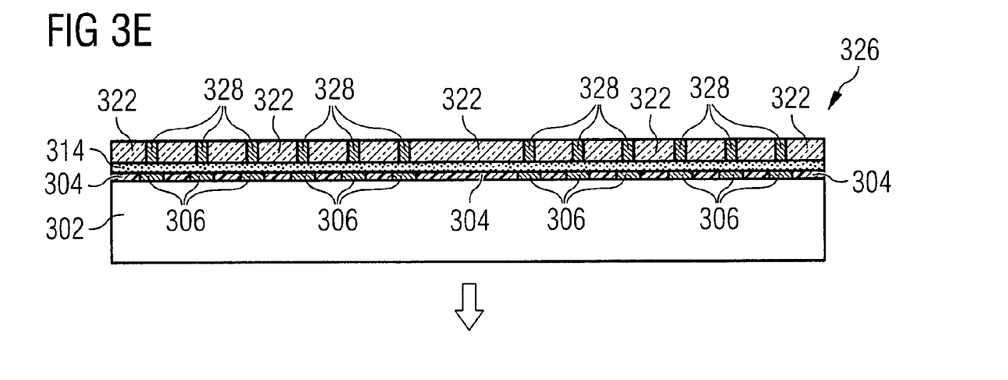
Figure 3F:
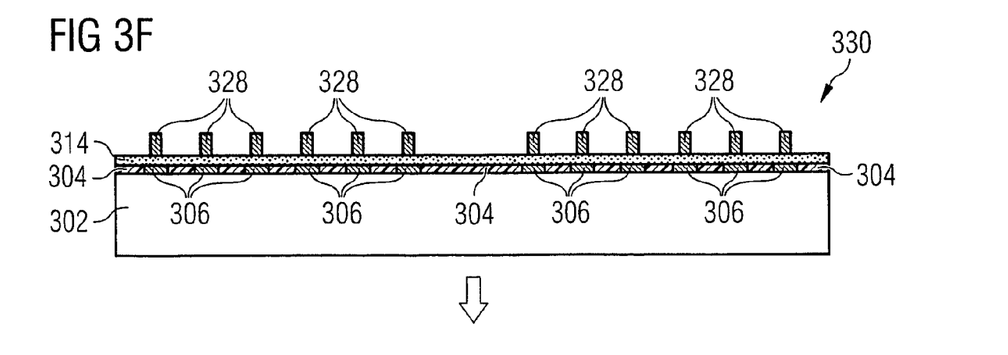
Figure 3G:
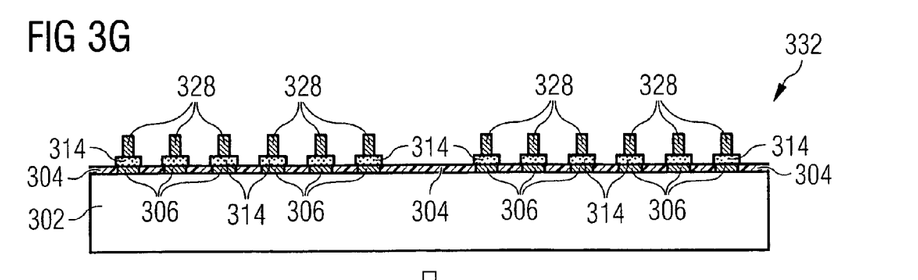
Figure 3H:
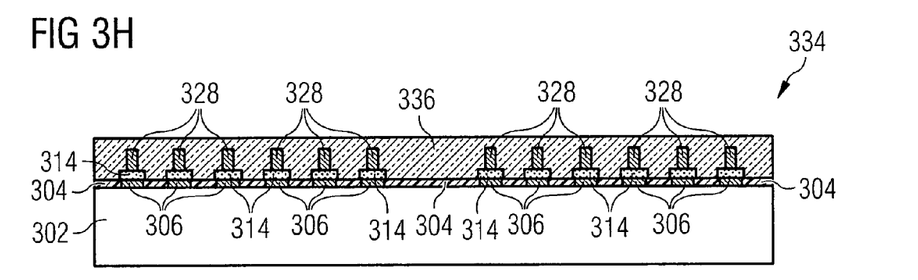
Figure 3I:
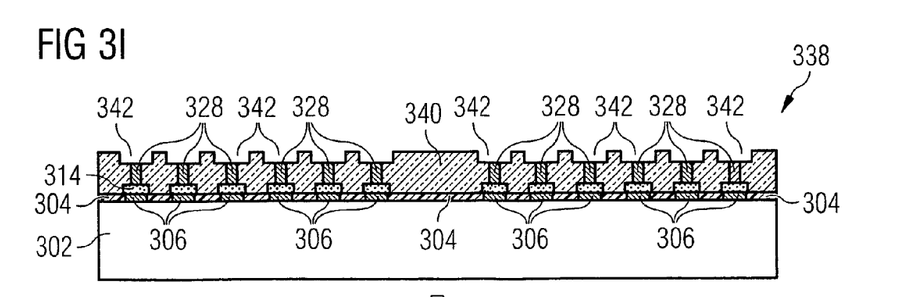
Figure 3J:
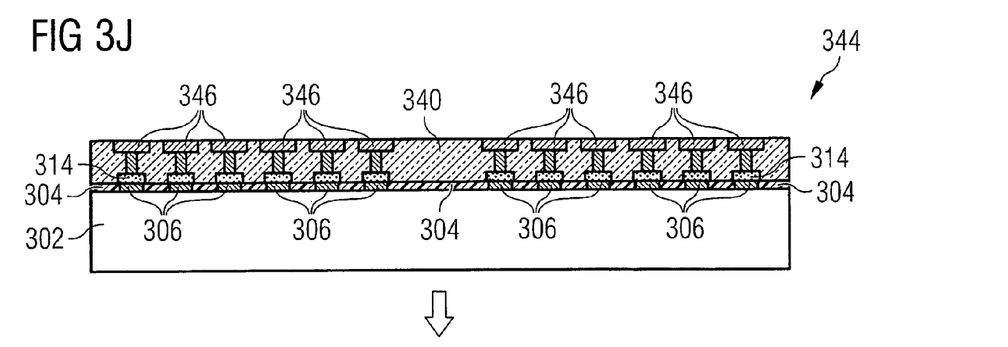
Figure 3K:
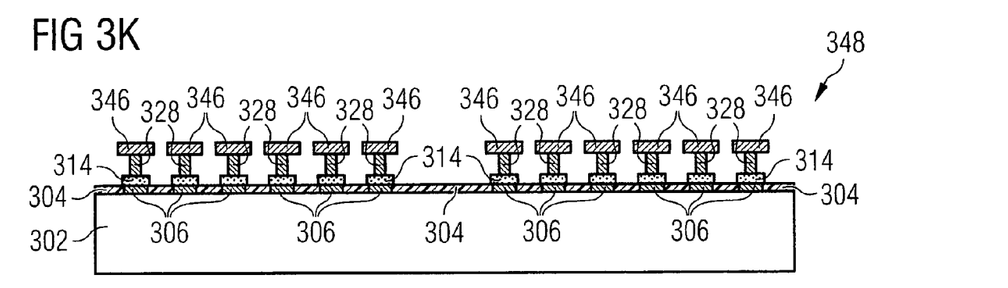
Figure 3L:
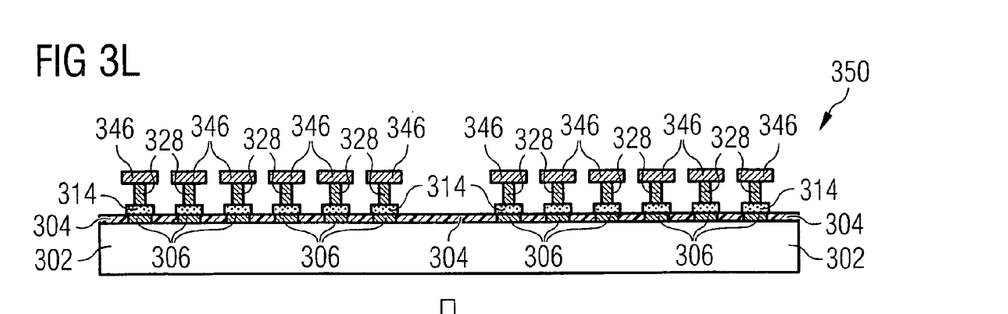
Figure 3M:
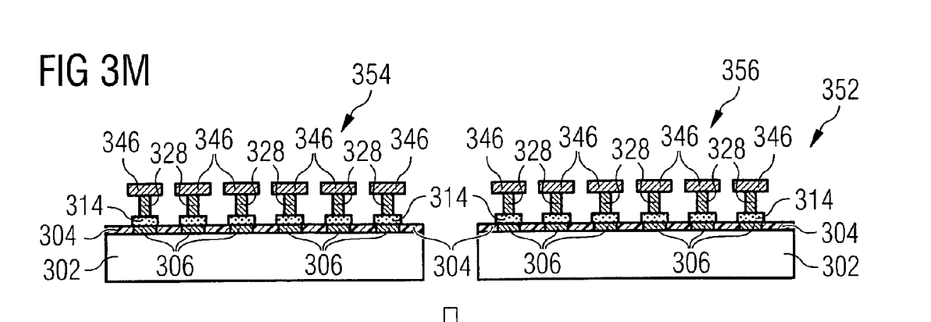
Figure 3N:
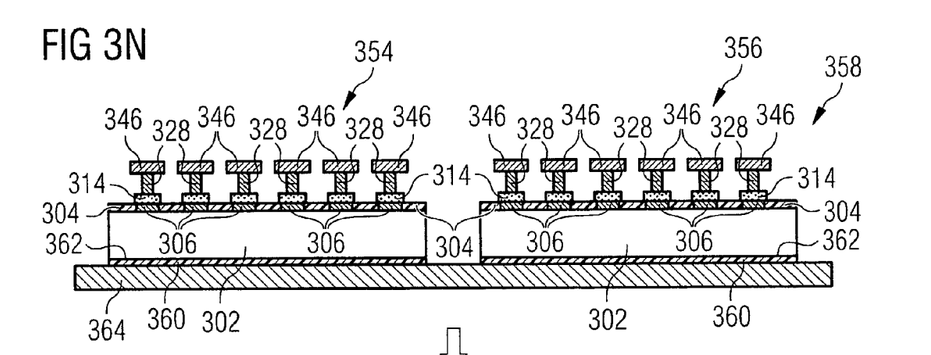
Figure 3O:
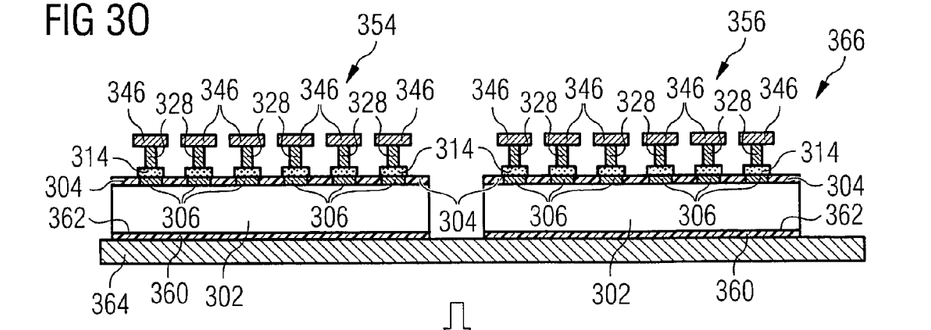
Figure 3P:
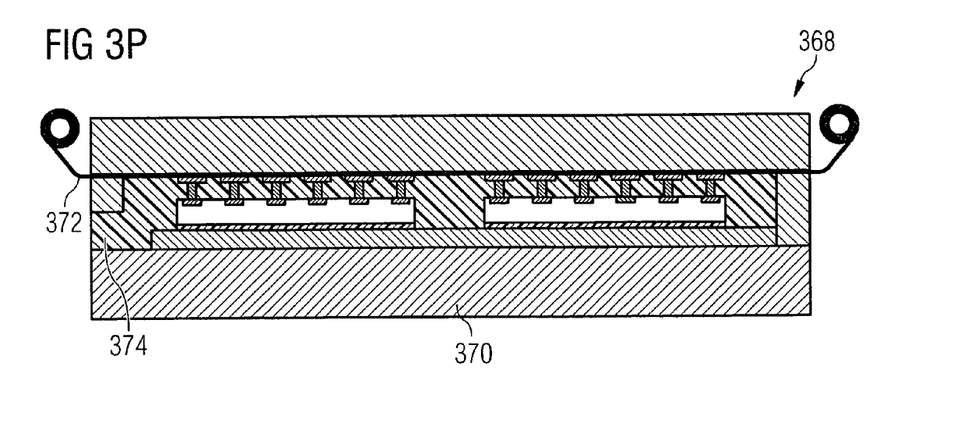
Figure 3Q:
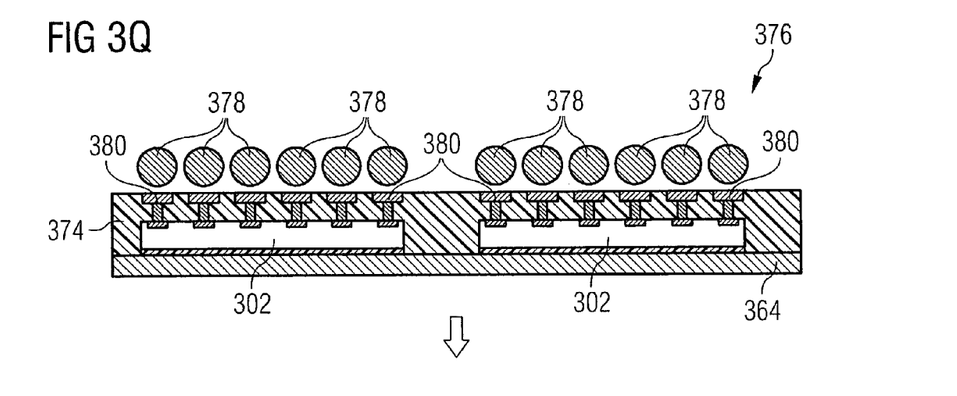
Figure 3R:
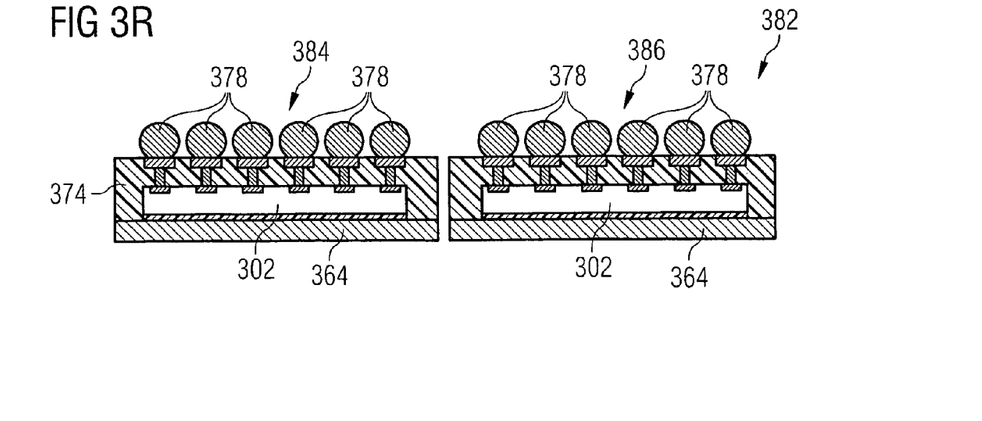
Figures 3S, 4, 5, 6, 7, 8:
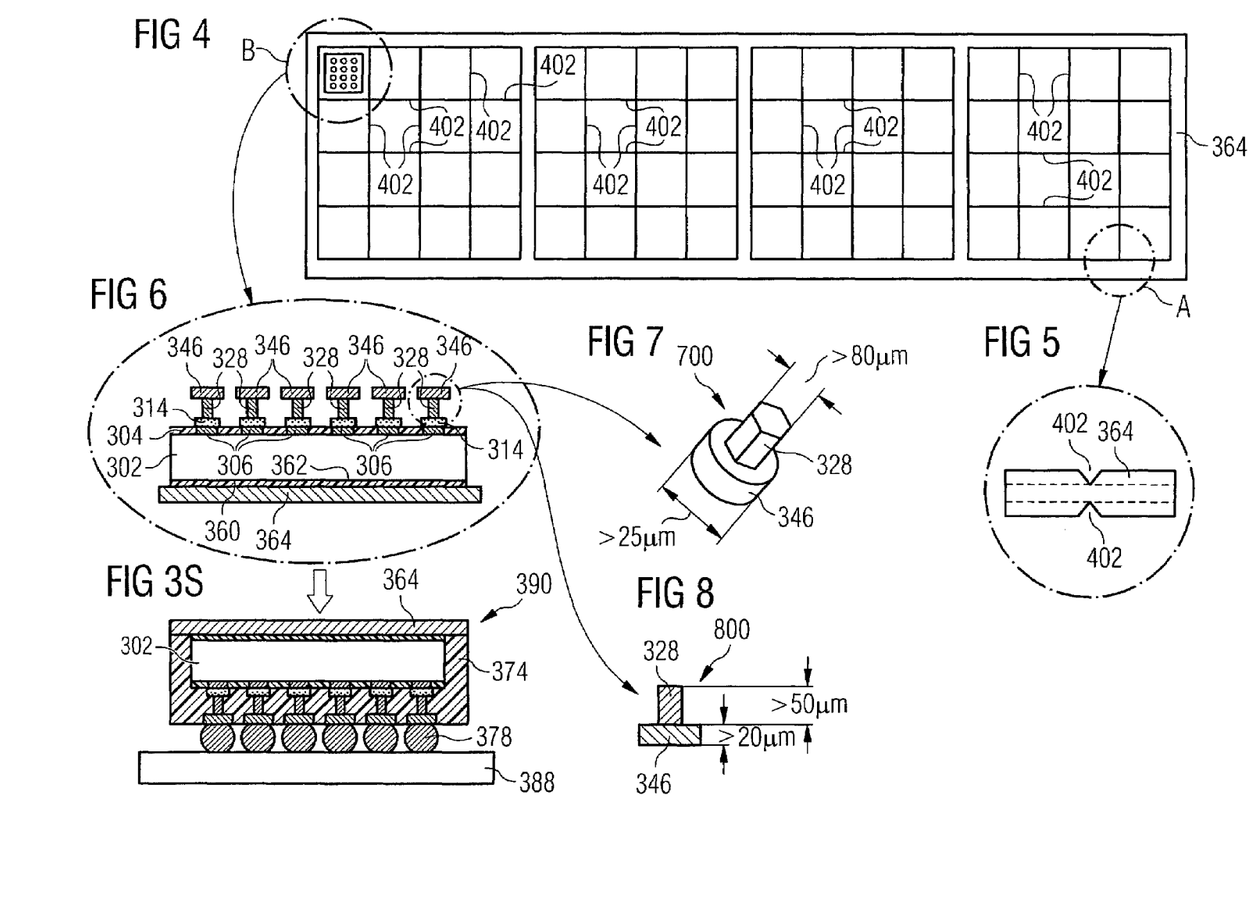
FIG. 4 illustrates a top view of a die configuration showing dies being attached to a metal plate in accordance with an exemplary embodiment of the present invention.
FIG. 5 illustrates a cross sectional view of a portion A of the metal plate of a die configuration of FIG. 4 in accordance with an exemplary embodiment of the present invention.
FIG. 6 illustrates a cross sectional view of a portion B of the die configuration of FIG. 4 in accordance with an exemplary embodiment of the present invention.
FIG. 7 illustrates a top side view of a bump of a die configuration in accordance with an exemplary embodiment of the present invention.
FIG. 8 illustrates a cross sectional view of a bump of a die configuration in accordance with an exemplary embodiment of the present invention.

FIGS. 3A to 3S illustrate cross sectional views of a die configuration in accordance with an exemplary embodiment of the present invention at different time instants of its manufacture.

Referring now to FIG. 3A, an incoming front-end-of-line processed wafer 300 comprising a wafer substrate 302, a plurality of electronic components (not shown), a passivation layer 304 on the active side of the wafer substrate 302 and die pads 306 is used as a starting point for the described packaging back-end-of-line process. The wafer substrate 302 is made of semiconductor material, although in another embodiment of the invention, other suitable materials can also be used, e.g., polymers. In an exemplary embodiment of the invention, the wafer substrate 302 is made of silicon (doped or undoped). In an alternative embodiment of the invention, the wafer substrate 302 is a silicon on insulator (SOI) wafer. As an alternative, any other suitable semiconductor materials can be used for the wafer substrate 302, for example semiconductor compound material such as gallium arsenide (GaAs), silicon germanium (SiGe) indium phosphide (InP), but also any suitable ternary semiconductor compound material or quaternary semiconductor compound material such as indium gallium arsenide (InGaAs).

As shown in FIG. 3A, a first die region 308 (on the left hand side of FIG. 3A) and a second die region 310 (on the right hand side of FIG. 3A) are shown for the manufacturing of a first die and a second die, respectively.

Subsequently, Under Bump Metallization (UBM) material 314 is applied (e.g., descumbed) over the entire exposed surface of the passivation layer 304 and the exposed die pads 306 by means of UBM sputtering (see structure 312 in FIG. 3B).

As shown in the structure 316 in FIG. 3C, a first photo resist layer 318 is applied on the UBM material 314 by means of spin coating or any other suitable process.

Using a lithography process using a first lithography mask (not shown), the first photo resist layer 318 is exposed. The exposed regions or the non-exposed regions are etched (depending on whether a positive first photo resist material or a negative first photo resist material is used), thereby forming a patterned first photo resist layer 322 (see structure 320 in FIG. 3D).

The holes 324 in the first photo resist layer 318 formed by the patterning are filled with a metal, e.g., with copper by means of electroplating or by means of electroless plating, thereby forming first partial pillar bumps 328 (see structure 326 in FIG. 3E). In other words, a first plating process is carried out for manufacturing the first partial pillar bumps 328.

In a next step, the patterned first photo resist layer 322 is stripped, thereby exposing the first partial pillar bumps 328, which are now clearly free standing structures on the UBM material and arranged above respective die pads 306 (see structure 330 in FIG. 3F).

As shown in FIG. 3G, the UBM material 314 is etched (anisotropically or isotropically) by means of wet etching or by means of dry etching, such that the first partial pillar bumps 328 are electrically isolated from each other. However, some UBM material 314 remains under the first partial pillar bumps 328 in order to respectively electrically connect each first partial pillar bump 328 with a respectively assigned die pad 306 (see structure 332 in FIG. 3G).

As shown in the structure 334 in FIG. 3H, a second photo resist layer 336 is applied on the exposed passivation layer 304 and the entire first partial pillar bumps 328 by means of spin coating or any other suitable process.

Using a lithography process using a second lithography mask (not shown), the second photo resist layer 336 is exposed. The exposed regions or the non-exposed regions are etched (depending on whether a positive second photo resist material or a negative second photo resist material is used), thereby forming a patterned second photo resist layer 340 (see structure 338 in FIG. 3I).

The holes 342 in the second photo resist layer 336 formed by the patterning and exposing the upper surface of the first partial pillar bumps 328, are filled with a metal, e.g., with copper by means of electroplating or by means of electroless plating, thereby forming second partial pillar bumps 346 (see structure 344 in FIG. 3J). In other words, a second plating process is carried out for manufacturing the second partial pillar bumps 346. The second partial pillar bumps 346 have a larger cross section (or diameter) than the first partial pillar bumps 328. Thus, the pillar bumps formed by the first partial pillar bumps 328 and the second partial pillar bumps 346 have a T-shape.

In a next step, the patterned second photo resist layer 340 is stripped, thereby exposing the first partial pillar bumps 328 and the second partial pillar bumps 346, which are now clearly free standing structures (e.g., free standing T-structures) on the UBM material and arranged above respective die pads 306 (see structure 348 in FIG. 3K).

As shown in the structure 350 in FIG. 3L, the wafer substrate 302 is thinned, e.g., by means of back grinding, thereby generating a thinned wafer structure 350.

Next, a wafer dicing process is carried out, thereby separating the thinned wafer structure 350 into a plurality of dies 354 and 356 (see die arrangement 352 in FIG. 3M). The wafer dicing process can be any suitable process including sawing, etching or breaking the thinned wafer structure 350.

A thermal interface material layer 360 is applied to the inactive side 362 of the now separated dies 354 and 356 and the separated dies 354 and 356 are attached to a metal plate 364 (see die arrangement 358 in FIG. 3N).

In a following step, a die attach cure process is carried out, thereby curing material used for the die attach (see die arrangement 366 in FIG. 3O).

As shown in FIG. 4 and FIG. 5, which is an enlarged cross sectional view of portion A in FIG. 4, the metal plate 364 provides a grid with a plurality of etch scribe lines 402 provided in a grid pattern in the metal plate 364.

FIG. 6 illustrates an enlarged cross sectional view of portion B in FIG. 4 and shows one die of the die arrangement 366 in FIG. 3O.

As shown in FIG. 7, each pillar bump 700 formed by a respective first partial pillar bump 328 and a respective second partial pillar bump 346 has a T-shape. The first partial pillar bump 328 has a cylindrical shape with a regular hexagonal cross section, wherein the diameter of the regular hexagon is larger than approximately 50 μm, e.g., larger than approximately 80 μm. The second partial pillar bump 346 has a cylindrical shape with a circular cross section, wherein the diameter of the circular base is larger than diameter of the cross section of the first partial pillar bump 328. By way of example, the diameter of the circular base is larger than approximately 200 μm, e.g., larger than approximately 250 μm. Furthermore, the first partial pillar bump 328 has a thickness of approximately at least 20 μm, for example of approximately at least 50 μm. The second partial pillar bump 346 has a thickness of approximately at least 10 μm, for example of approximately at least 20 μm (see cross sectional view 800 in FIG. 8).

Referring now to the die arrangement 368 in FIG. 3P, the attached dies 354 and 356 are molded using a tape molding process. In other words, the attached dies 354 and 356 are placed in a molding unit 370 and the upper surfaces of the second partial pillar bumps 346 are covered with a tape 372. Then, mold material 374, such as an epoxy resin, is injected into the molding unit 370, thereby filling the entire hollow space of the molding unit 370 with the mold material 374.

It should be noted that in FIG. 3P, FIG. 3Q and FIG. 3R, the dies 354 and 356 are shown in a simplified form, i.e., without the passivation layer 304 and the UBM material 314.

After the inject molding process has been completed, the molded attached dies 354 and 356 are taken out of the molding unit 370 and the package formed in this way is further processed as shown in FIG. 3Q.

In a following step, ball grid array solder balls 378 are mounted on the copper pads 380, i.e., the exposed upper surfaces of the second partial pillar bumps 346, which are exposed due to the usage of the tape during the injection mold process (see die arrangement 376 in FIG. 3Q).

After the ball grid array solder balls 378 have been mounted on the copper pads 380, the package is separated by means of a package dicing process (e.g., by means of sawing or etching or breaking the package), thereby forming packaged dies 384 and 386 (see die arrangement 382 in FIG. 3R).

The packaged dies 384 and 386 have the same structure as the die configuration 100 as shown in FIG. 1.

Next, the packaged dies 384 and 386 are mounted on the printed circuit 388 board by means of the BGA solder balls 378 (see die arrangement 390 in FIG. 3S).

The process of manufacturing the die configuration 200 as shown in FIG. 2 is similar to the process described with reference to FIGS. 3A to 3S with the steps of forming the thermal interface material being omitted.

In an exemplary embodiment of the invention, the packaged dies are wafer level package (WLP) dies.

In an exemplary embodiment of the invention, copper pillar bumping is used as the interconnect method for the chip (die) and the printed circuit board. The copper pillar bumps used in accordance with an exemplary embodiment of the invention are plated in two steps. The first step is used to grow the main interconnecting pillar (having a diameter of larger than approximately 50 µm, for example) and the second step is used to enlarge the end of the pillar to allow normal solder ball attachment (the pad diameter being larger than approximately 250 µm, for example). The bumped wafer is then processed through pre-assembly such as backgrinding and dicing. The diced chips are then attached to an etched metal plate using an optional thermal interface material, which is subsequently cured. The metal plate will temporarily serve as the chip carrier through the assembly process and at the end will serve as the package's heat sink. The metal plate with the attached chips is processed by means of tape molding to allow the pad area to be exposed for the subsequent BGA solder attachment. The further processing steps are similar to a normal BGA packaging process.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A die configuration, comprising:
   a die;
   mold material around the die;
   one side of the die comprising die pad regions;
   die configuration connecting members; and
   die connecting members connecting the die configuration connecting members to the die pad regions through the mold material, each die connecting member of the die connecting members being formed by a bump, the bump comprising a first partial bump and a second partial bump, the second partial bump having a different width than the first partial bump;
   wherein the die configuration connecting members are located adjacent the second partial bump.

2. The die configuration of claim 1, wherein the die has an active side and an inactive side being opposed to the active side, the die configuration further comprising a heat sink coupled to the inactive side.

3. The die configuration of claim 2, wherein the heat sink comprises a metal plate.

4. The die configuration of claim 1, wherein the die configuration connecting members comprise solder members.

5. The die configuration of claim 4, wherein the solder members comprise ball grid array solder bumps.

6. The die configuration of claim 4, wherein the solder members comprise lead-free solder members.

7. The die configuration of claim 1, wherein the die pad regions are electrically coupled to electronic components of the die.

8. The die configuration of claim 1, wherein the bump comprises a pillar bump.

9. The die configuration of claim 1, wherein the bump comprises a metal bump.

10. The die configuration of claim 1, wherein the bump comprises a copper bump.

11. The die configuration of claim 1, wherein the second partial bump has a greater width than the first partial bump.

12. A die configuration, comprising:
    a die having an active side and an inactive side opposed to the active side;
    a thermal interface material layer on the inactive side of the die;
    a metal plate adjacent the inactive side of the die, the thermal interface material layer between the metal plate and the die;
    mold material around the die, at least partially exposing the metal plate;
    die pad regions on the active side of the die; and
    die connecting members connecting the die pad regions to die configuration pad regions through the mold material.

13. The die configuration of claim 12, further comprising die configuration connecting members coupled to the die configuration pad regions.

14. The die configuration of claim 13, wherein the die configuration connecting members comprise solder members.

15. The die configuration of claim 12, further comprising a circuit board connected to the die configuration pad regions.

16. The die configuration of claim 15, wherein the circuit board comprises a printed circuit board.

17. A die configuration, comprising:
    a die;
    a metal plate, a first side of the die being connected to the metal plate;
    mold material around the die, at least partially exposing the metal plate;
    a second side of the die being opposed to the first side of the die and comprising die pad regions;
    die configuration connecting members;
    die connecting members connecting the die configuration connecting members to the die pad regions through the mold material, wherein each die connecting member of the die connecting members includes a metal pillar bump, the pillar bump comprising a first partial bump and a second partial bump, the second partial bump having a greater width than the first partial bump, and
    a printed circuit board connected to the die configuration pad regions;
    wherein the die configuration connecting members are located on the second partial bump.

18. A die configuration, comprising
    a die having an active side and an inactive side opposed to the active side;
    a heat sink internally coupled to the inactive side of the die; and
    a thermal interface material between the inactive side of the die and the heat sink;
    mold material around the die, at least partially exposing the metal plate;
    die pad regions on the active side of the die; and
    die connecting members connecting the die pad regions to die configuration pad regions through the mold material.

19. The die configuration of claim 18, wherein the heat sink comprises a metal heat sink.

20. The die configuration of claim 18, further comprising die configuration connecting members coupled to the die configuration pad regions.

21. The die configuration of claim 20, wherein the die configuration connecting members comprise solder members.

22. The die configuration of claim 18, further comprising a circuit board connected to the die configuration pad regions.

23. The die configuration of claim 22, wherein the circuit board comprises a printed circuit board.

* * * * *